(12) United States Patent
Flake

(10) Patent No.: US 9,331,842 B2
(45) Date of Patent: May 3, 2016

(54) TIME SYNCHRONIZATION AND CONTROLLED ASYNCHRONIZATION OF REMOTE TRIGGER SIGNALS

(71) Applicant: BOARD OF REGENTS OF THE UNIVERSITY OF TEXAS SYSTEM, Austin, TX (US)

(72) Inventor: Robert H. Flake, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/862,515

(22) Filed: Sep. 23, 2015

(65) Prior Publication Data
US 2016/0087785 A1    Mar. 24, 2016

Related U.S. Application Data

(60) Provisional application No. 62/054,147, filed on Sep. 23, 2014.

(51) Int. Cl.
*H04L 7/00* (2006.01)
*H04B 17/364* (2015.01)

(52) U.S. Cl.
CPC ............ *H04L 7/0041* (2013.01); *H04B 17/364* (2015.01); *H04L 7/0091* (2013.01)

(58) Field of Classification Search
CPC ...... G01R 31/11; G01R 31/021; G01R 27/06; G01R 31/10; H04L 12/2697; H04L 25/0272; H04L 7/0033; H04L 43/0852; H04L 7/00; H04L 7/06; G01F 23/284; G01M 11/3118

USPC .......... 375/257, 354, 260, 355, 356; 324/533, 324/534, 642, 539, 532, 535, 617, 543; 370/304, 324, 509

See application file for complete search history.

(56) References Cited

U.S. PATENT DOCUMENTS

| 4,538,103 A | * | 8/1985 | Cappon | .................. | G01R 31/11 324/534 |
| 6,441,695 B1 | | 8/2002 | Flake | | |

(Continued)

OTHER PUBLICATIONS

Bogatin, Eric—"Exponentially Increasing Waveforms' Special Property"; PCBDesign007; Aug. 5, 2009; Bogatin Enterprises (2 pages).

(Continued)

*Primary Examiner* — Rahel Guarino

(74) *Attorney, Agent, or Firm* — Meyertons Hood Kivlin Kowert & Goetzel, P.C.; Jeffrey C. Hood; Mark K. Brightwell

(57) ABSTRACT

A mechanism is disclosed for transmitting pulses onto respective cables so that the pulses arrive at the remote ends of the respective cables in synchronized (or controllably asynchronized) fashion. First, the round-trip time of flight of each cable is measured using speedy delivery pulses, i.e., pulses whose leading edges have exponential shape. Second, a calculation is performed to determine the input delay(s) between the pulses that would produce desired output delay(s). For example, it may be desirable that the pulses arrive at the respective remote ends at the same time, in which case the desired output delay(s) is (are) zero. Third, the same speedy delivery pulses are transmitted onto the respective cables so that the interpulse delay(s) conform to the computed input delay(s). Thus, the desired output delay(s) are achieved at the remote ends of the cables.

28 Claims, 10 Drawing Sheets

(56) References Cited

U.S. PATENT DOCUMENTS

| | | | |
|---|---|---|---|
| 6,847,267 | B2 | 1/2005 | Flake |
| 7,375,602 | B2 | 5/2008 | Flake |
| 7,859,271 | B2 | 12/2010 | Flake |
| 8,093,911 | B2 | 1/2012 | Flake |
| 8,269,647 | B2 | 9/2012 | Solis |
| 8,867,657 | B1 | 10/2014 | Flake |
| 8,923,444 | B1 | 12/2014 | Flake |

OTHER PUBLICATIONS

Wang, S. J.; I. Lopez, S.L. Liao, and Robert H. Flake—"Advances in Test Technology for Metal Cables" Central Texas IEEE Communication/Signal Processing Society, May 19, 2005 (44 pages).

Flake et al. "Advances in Test Technology for High-Performance System Interconnects," Proceedings of the 12.sup.th International Conference, Mixed Design of Integrated Circuits and Systems, Mixdes 2005, Krakow, Poland Jun. 22-25, 2005 (5 pages).

Flake, "Part I (Theory) Signal Propagation without Distortion on Lossy Transmission Lines Having Frequency Dependent Parameters," Proceedings of the 9.sup.th IEEE workshop on signal propagation on interconnects, pp. 43-45, May 10-13, 2005; Garmish-Partenkirchen, Germany (3 pages).

Flake, Robert and John Biskup; "Part II (Experiments) Signal Propagation without Distortion on Lossy Transmission Lines Having Frequency Dependent Parameters", Proceedings of the 9.sup.th IEEE Workshop on Signal Propagation on Interconnects, May 10-13, 2005; pp. 51-54; Garmish-Partenkirchen, Germany (4 pages).

Flake, Robert and John Biskup, "Signal Propagation without Distortion in Dispersive Lossy Media," 11.sup.th IEEE Intl. Conf. Electronics, Circuits and System Proceedings, Dec. 2004,Tel-Aviv, Israel (4 pages).

Flake et al. "A New Type of Test Signal for Improved TDR Resolution" Proc.TDR2006, Paper ID 34, Sep. 2006, Purdue University, West Lafayette, United States (16 pages).

\* cited by examiner

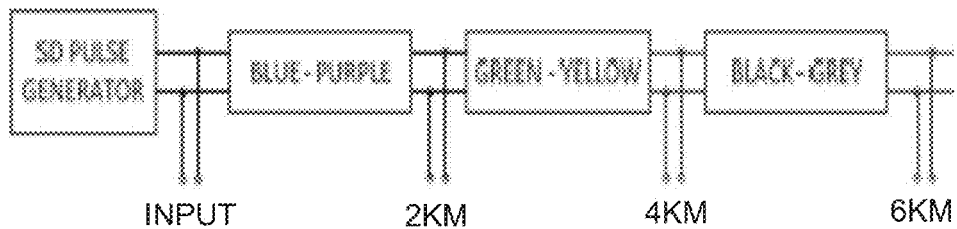
Fig. 1 SD Waveform Propagation Test Configuration
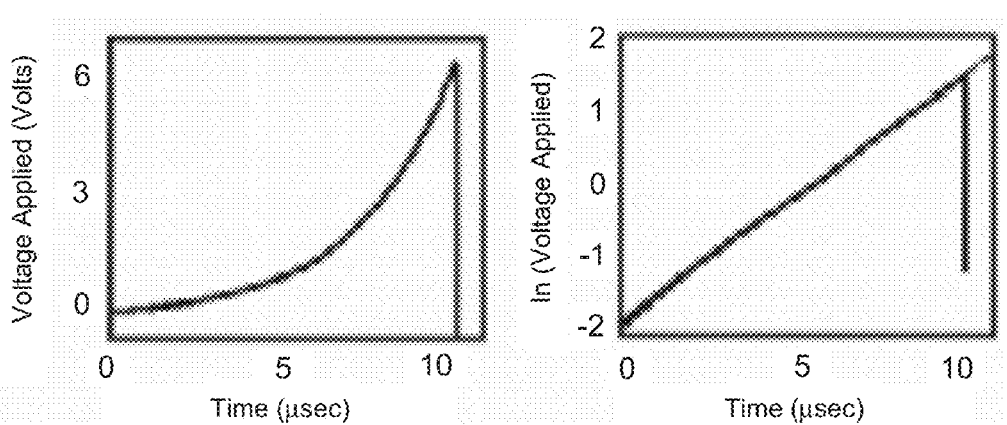
Fig. 2 SD Waveform (and it Logarithm) applied to the input of the test cable
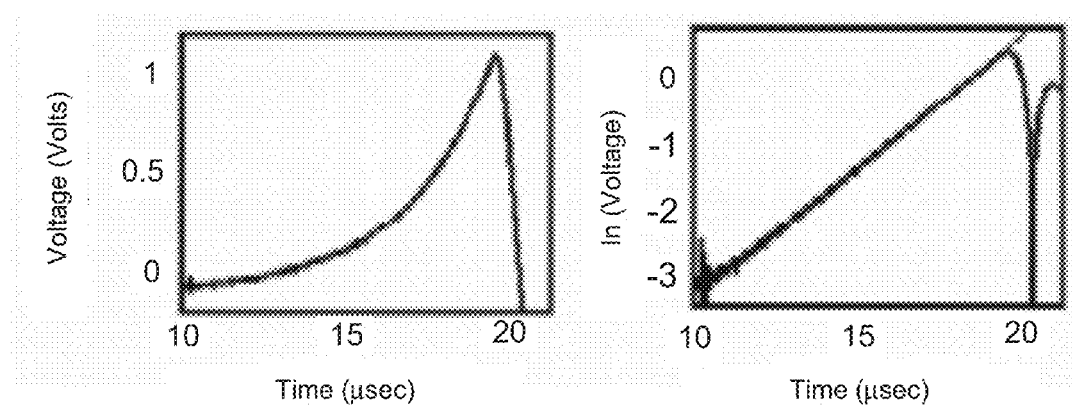
Fig. 3 SD Waveform (and its logarithm) measured at 2 km

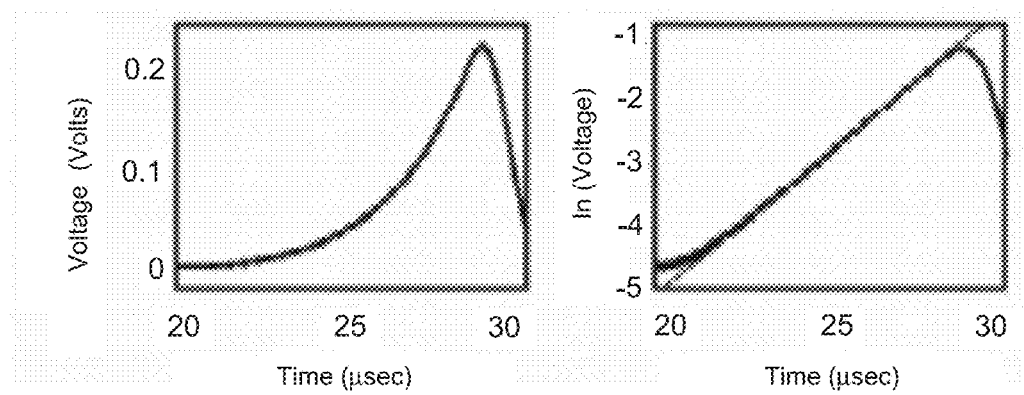
Fig. 4 SD Waveform (and its logarithm) measured at 4km
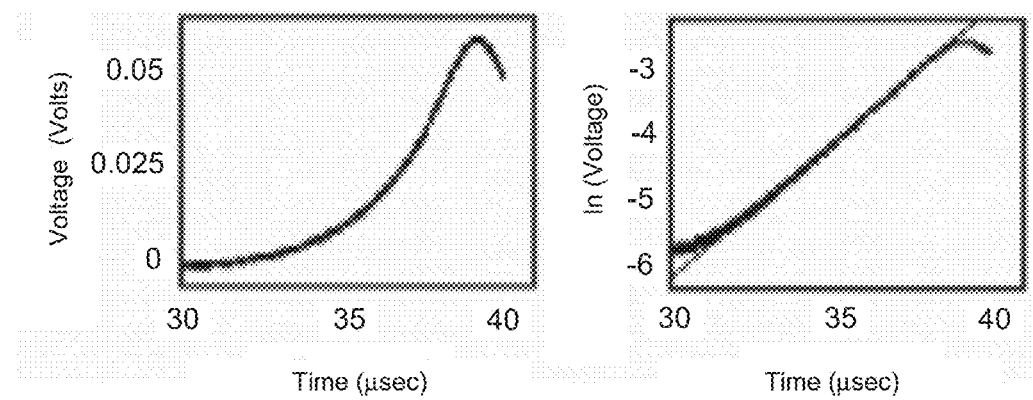
Fig. 5 SD Waveform (and its logarithm) measured at 6km

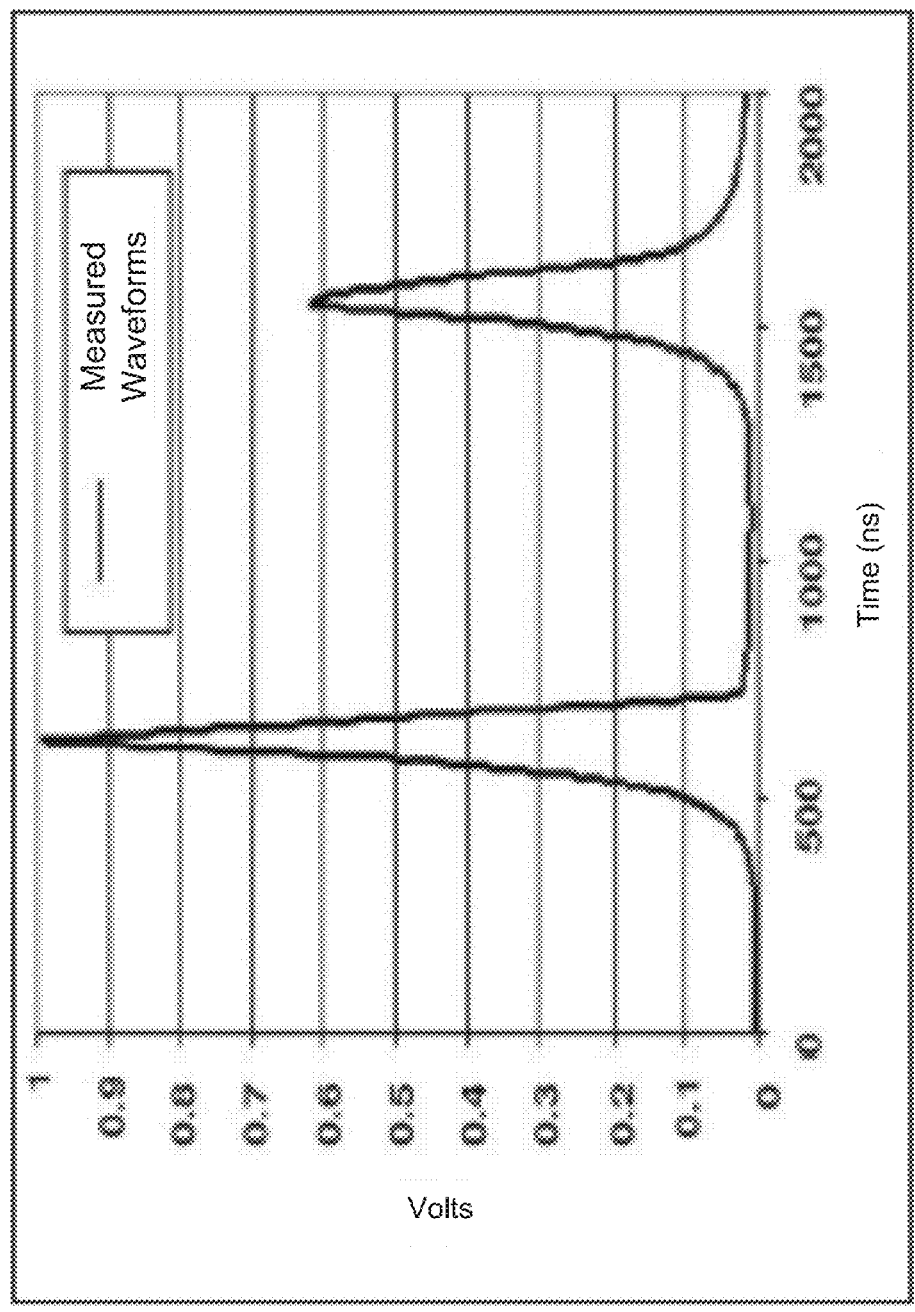
Fig. 6 The SD pulse on the left was the input to the RG-58/U cable, and the pulse on the right was the reflected signal after traveling ~200m of coaxial cable.

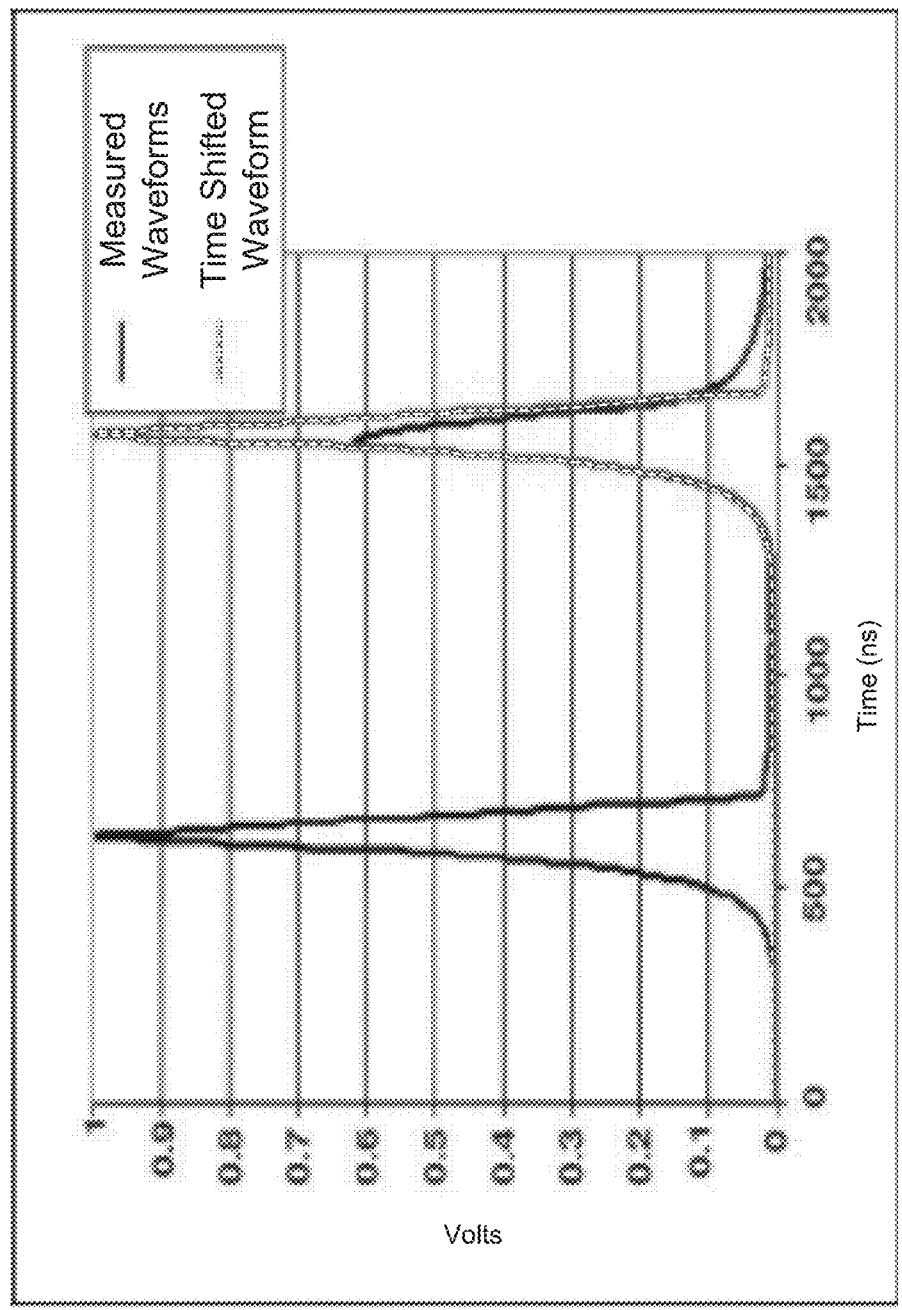
Fig. 7 The SD pulse on the left was the input to the RG-58/U cable, and the smaller pulse on the right was the reflected signal after traveling ~200m of coaxial cable. The larger pulse on the right is a time shifted version of the input SD pulse, showing that the shape was preserved.

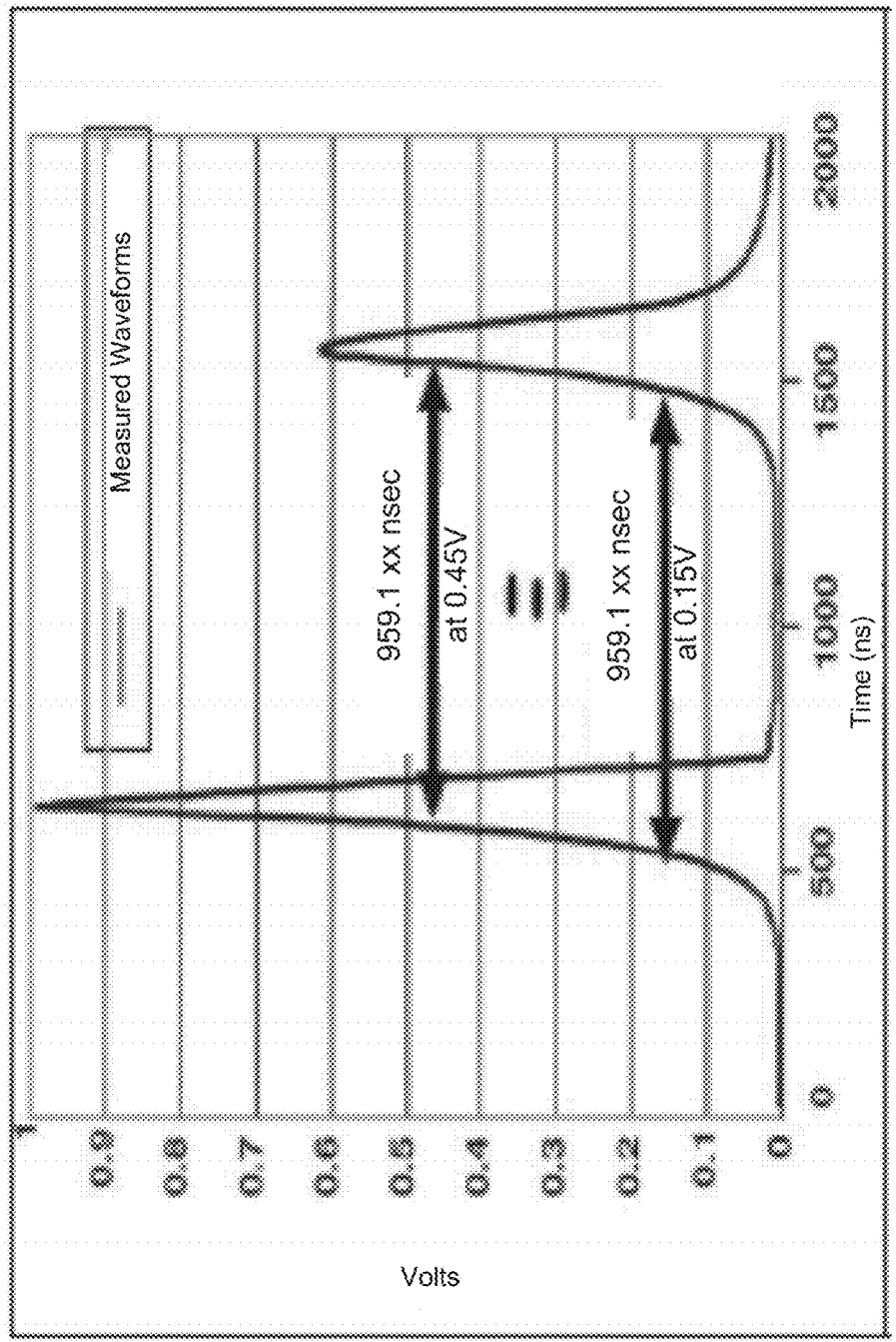
Fig. 8 Measurement of SD Pulse Delay along RG-58/U Coaxial Cable. The multiple Threshold voltage level Time of Flight (TOF) measurements shown are averaged to obtain the signal TOF

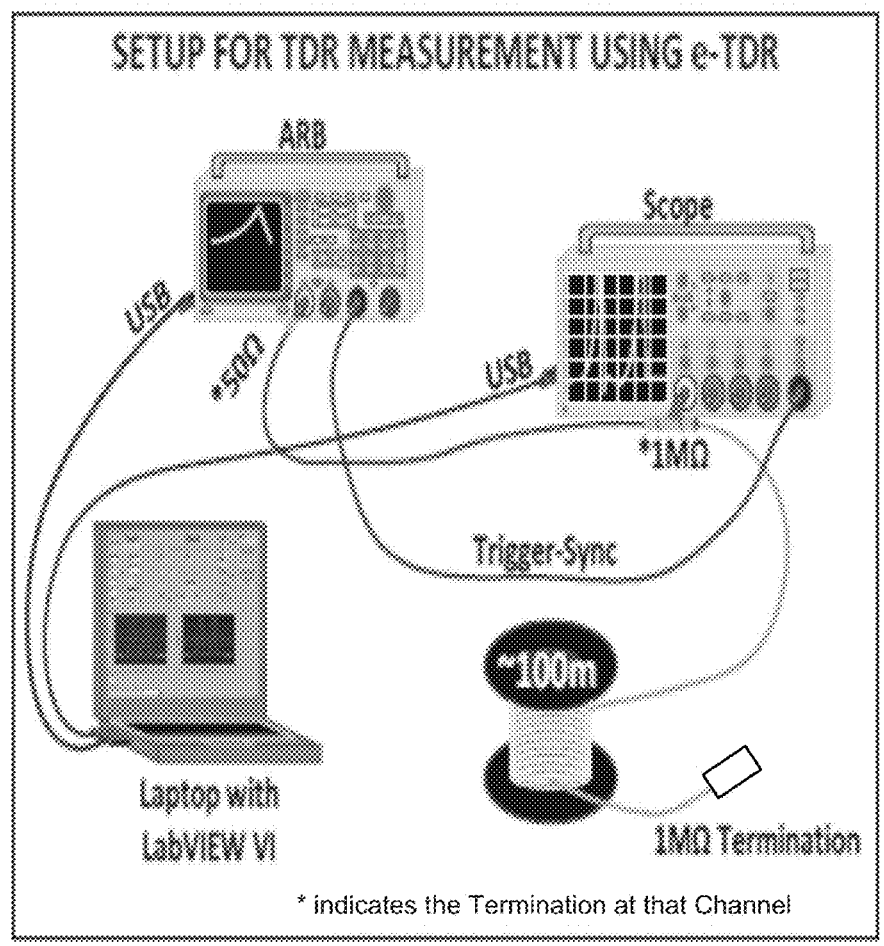
Fig. 9 e-TDR Measurement on a ~100m RG-58/U Coaxial Cable

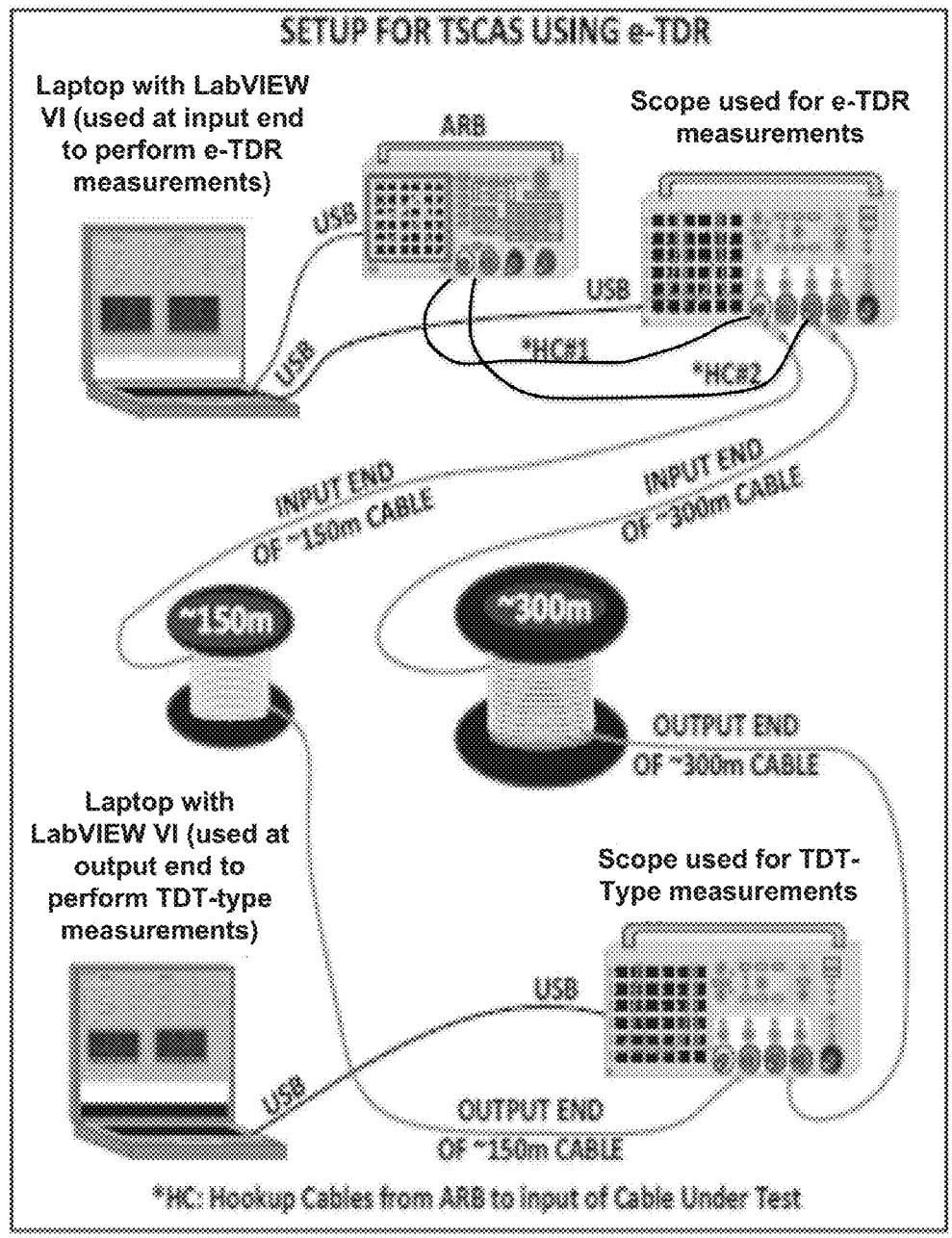
Fig. 10: Setup for TSCAS measurements using e-TDR with Coil-I, ~150m RG-58/U Coaxial Cable and Coil-II, ~300m RG-58/U Coaxial Cable

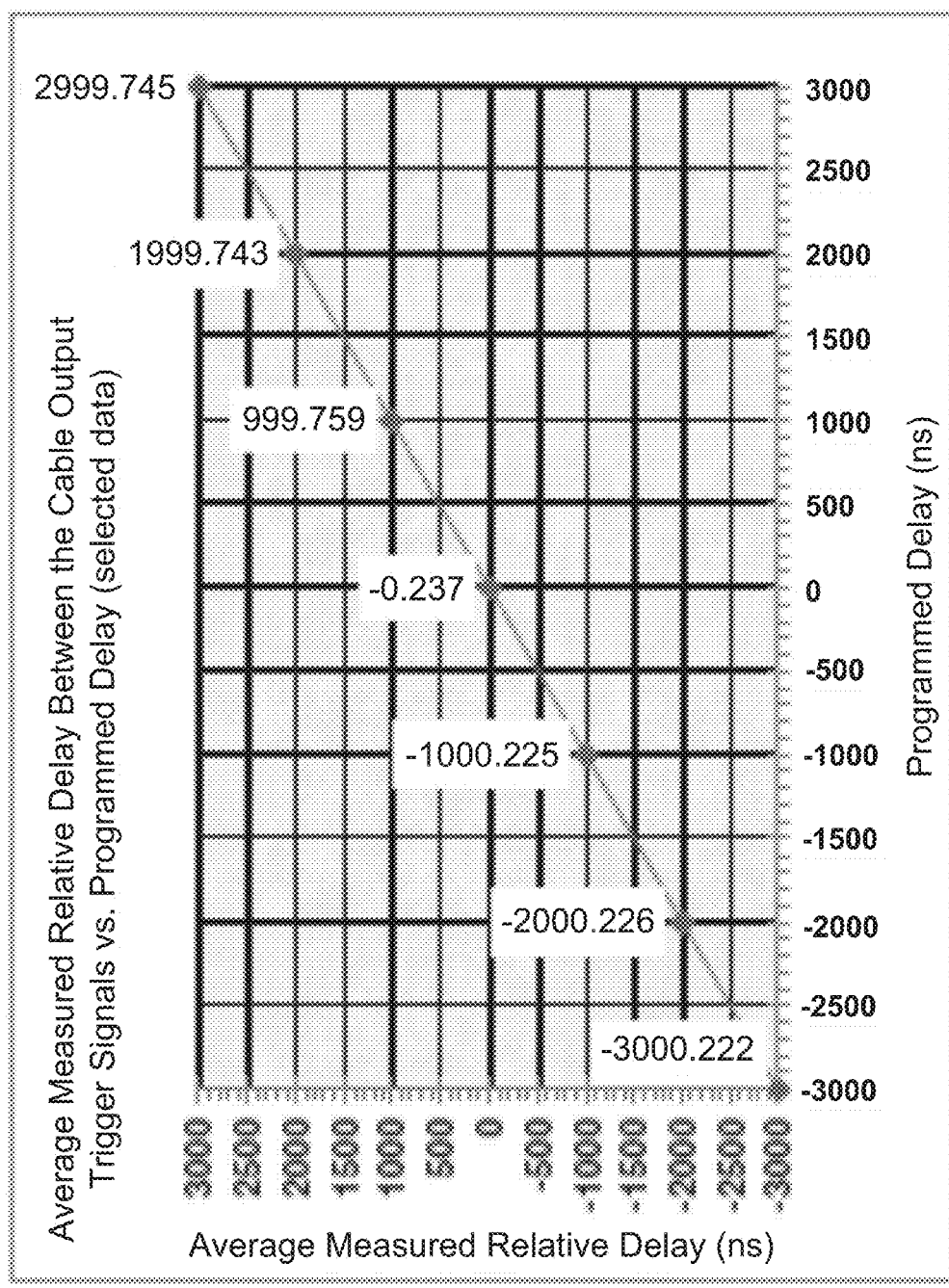
Fig. 11: Average measured relative delay vs. target delay.

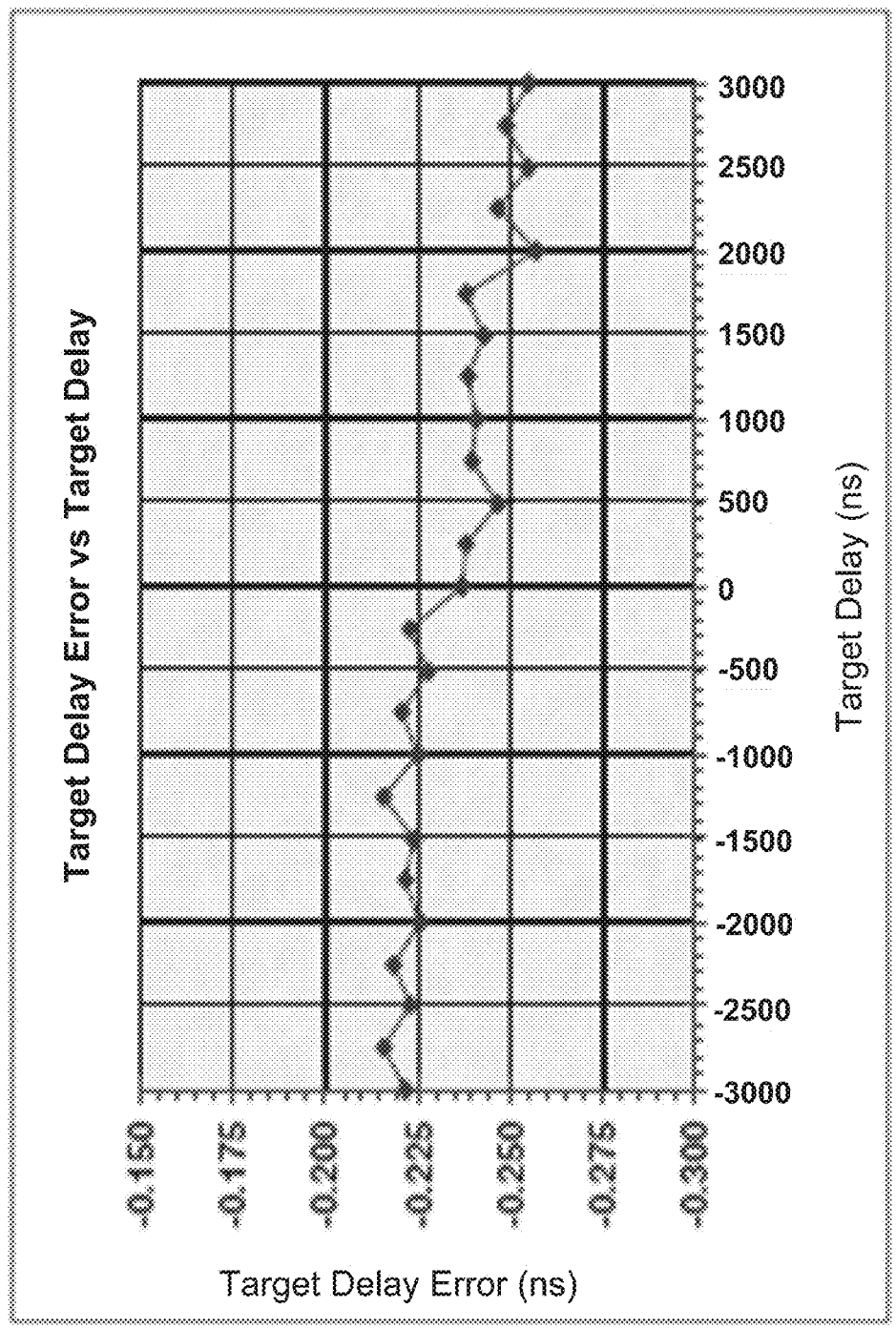
Fig. 12: Controlled asynchronization error = average measured delay − target delay

1300 perform time of flight measurements using time-domain reflectometry (TDR) circuitry, wherein said performing time of flight measurements includes:
  measuring a round-trip time of flight $TOF_1$ for a first pulse that is transmitted onto a first cable at a first end of the first cable, wherein the first pulse has a leading edge with exponential shape; and
  measuring a round-trip time of flight $TOF_2$ for a second pulse that is transmitted onto a second cable at a first end of the second cable, wherein the second pulse has a leading edge with exponential shape    *1310* determine time delay information, wherein said determining time delay information includes computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$    *1320* perform pulse transmission according to the time delay information, wherein said pulse transmission includes: transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable
*1330*

*FIG. 13*

TIME SYNCHRONIZATION AND CONTROLLED ASYNCHRONIZATION OF REMOTE TRIGGER SIGNALS

PRIORITY CLAIM INFORMATION

This application claims priority to U.S. Provisional Application No. 62/054,147, filed Sep. 23, 2014, titled "Time Synchronization and Controlled Asynchronization of Remote Analog Signals with Sub-Nanosecond Resolution", by Robert H. Flake and Aparna Sripada. That Provisional Application is hereby incorporated by reference in its entirety as though fully and completely set forth herein.

FIELD

The presently described embodiments relate to the field of temporal synchronization of analog signals, and more particular, to a system and method for synchronizing (with high resolution) the arrival of pulses at the ends of respective cables.

DESCRIPTION OF THE RELATED ART

Given a central unit that is coupled remote units via respective cables, the central unit may transmit pulses onto the respective cables in order to initiate processes (e.g., control and/or measurement processes) at the two or more remote units. Each remote unit may be configured to perform a respective process in response to receiving the respective pulse from the respective cable. Oftentimes there is a desired constraint on the times of arrival of the pulses at the respective remote units. For example, it may be desired that the pulses arrive at the respective remote units simultaneous, for with a predetermined set of inter-pulse time delays. However, conventional pulses used for remote process initiation suffer from dispersion and propagate without a well-defined velocity in lossy media. Thus, in the context of conventional art, it may be difficult to arrange for the synchronization or controlled asynchronization of pulse arrivals in lossy media.

SUMMARY

Suppose a central unit is coupled to two remote units via two respective cables (or more generally, electrical conductors), each having a local end and a remote end. (The "local" end is the end proximate to the central unit. The "remote end" is the end opposite to the local end.) The two remote units may be situated at different locations.

We desire to bring about the favorable condition that two pulses transmitted onto the two respective cables at their local ends arrive at the remote ends at the same time, or with a desired value $\Delta t_{OUT}$ of time delay. (The present method naturally generalizes to an arbitrary number of cables and respective remote units. However, we start with two cables and units, for simplicity of discussion.) The central unit may include a two-channel signal generator (or more generally, an N-channel signal generator, where N is greater than or equal to 2.) The signal generator may be used to generate the two pulses. Each channel of the signal generator outputs a respective one of the two pulses. The two pulses are applied to the local ends of the respective cables.

In some embodiments, the presently disclosed method includes the following steps, wherein speedy delivery signals are used as the stimulus for TDR measurements on the cables and as the cable input trigger signals (CITSs) in the operational phase. The speedy delivery signals are non-dispervise and travel with constant propagation velocity in lossy media.

(1) Measure the round-trip time of flight $TOF_A$ for a speedy delivery pulse $P_A$ that is transmitted onto cable A at its local end. A speedy delivery pulse is a pulse whose leading edge is exponentially shaped. Thus, the leading edge of the speedy delivery pulse $P_A$ may have the form $$P_A(t) = D_A \exp(\alpha_A t),$$

where $\alpha_A$ is a positive real constant, where $D_A$ is a non-zero real constant, where t is time. (In some embodiments, the leading edge of the pulse $P_A$ is truncated at a finite amplitude. In some embodiments, the leading edge is followed by a trailing edge which returns continuously or smoothly to zero amplitude.) The round-trip time of flight $TOF_A$ is the time required for the pulse $P_A$ to propagate through the cable A, reflect off the remote end of the cable A, and return to the local end of the cable A. (During the measurement of the time of flight $TOF_A$, the remote end of the cable A may be coupled to a termination impedance that ensures total reflection of the pulse at the remote end. The termination impedance may be removed after the time of flight $TOF_A$ has been measured.) The time of flight $TOF_A$ may be determined by averaging a plurality of amplitude-specific time-of-flight values as disclosed in U.S. Pat. No. 8,867,657.

(2) Measure the round-trip time of flight $TOF_B$ for a second speedy delivery pulse $P_B$ that is transmitted onto cable B at its local end. The leading edge of the speedy delivery pulse $P_B$ may have the form $$P_B = D_B \exp(\alpha_B t),$$

where $\alpha_B$ is a positive real constant, where $D_B$ is a non-zero real constant. (In some embodiments, the leading edge of the pulse $P_B$ is truncated at a finite amplitude. In some embodiments, the leading edge is followed by a trailing edge which returns continuously or smoothly to zero amplitude.) The round-trip time of flight $TOF_B$ is the time required for the pulse $P_B$ to propagate through the cable B, reflect off the remote end of the cable B, and return to the local end of the cable B. (During the measurement of the time of flight $TOF_B$, the remote end of the cable B may be coupled to a termination impedance that ensures total reflection of the pulse at the remote end. The termination impedance may be removed after the time of flight $TOF_B$ has been measured.) The time of flight $TOF_B$ may be measured using the above-mentioned time-of-flight averaging technique. In some embodiments, $\alpha_A$ and $\alpha_B$ are different. (For example, it may be advantageous for the speedy delivery pulse transmitted onto the longer cable to have a smaller value of parameter $\alpha$.) In other embodiments, $\alpha_A$ and $\alpha_B$ are identical.

In some embodiments, the measurements (1) and (2) may be performed at least partially in parallel, e.g., using: a two-channel arbitrary waveform generator (ARB) to generate the pulses $P_A$ and $P_B$, i.e., one pulse per channel; and a two-channel oscilloscope to capture the two return pulses. Alternatively, the measurements (1) and (2) may be performed sequentially.

In some embodiments, the measurements (1) and (2) may be performed using measurement circuitry including a two-channel ARB, an oscilloscope and a computer. In other embodiments, the measurements (1) and (2) may be performed using one or more dedicated hardware devices, e.g., using:

a two-channel exponential signal generator to generate the pulses $P_A$ and $P_B$, with each pulse generated by a respective one of the generator channels;

a two-channel signal digitization unit to capture the return pulses at the local ends of the cables;

dedicated digital circuitry (such as an ASIC);

or any combination of the foregoing.

(3) In anticipation of the operational phase (4), where the same speedy delivery pulses $P_A$ and $P_B$ will be transmitted again, compute an input time delay $\Delta t_{IN}$ between the two speedy delivery pulses $P_A$ and $P_B$ that would give the desired output time delay $\Delta t_{OUT}$ according to the relation:

$$\Delta t_{IN} = (TOF_A/2) - (TOF_B/2) + \Delta t_{OUT}.$$

(Note that the division of each round-trip time of flight by two gives a respective one-way time of flight. In other words, $TOF_A/2$ is the one-way time of flight through the cable A, and $TOF_B/2$ is the one-way time of flight through cable B.) The input time delay $\Delta t_{IN}$ is defined as the time the speedy delivery pulse $P_B$ will be transmitted onto cable B minus the time the speedy delivery pulse $P_A$ will be transmitted onto cable A. (The pulses will be transmitted onto the cables at their local ends.) Similarly, the output time delay $\Delta t_{OUT}$ is defined as the time the speedy delivery pulse $P_B$ will arrive at the remote end of cable B minus the time the speedy delivery pulse $P_A$ will arrive at the remote end of cable A.

The signal generator may include two output channels and a programmable delay circuitry, wherein the programmable delay circuitry capable of delaying the generation of the pulse $P_B$ on the second output channel (channel B) relative to the generation of the pulse $P_A$ on the first output channel (channel A). Thus, any desired value of input delay $\Delta t_{IN}$ can be achieved. (The temporal resolution of the input delay $\Delta t_{IN}$ may be limited by the frequency of the internal clock driving the delay circuitry). Therefore, any desired value of $\Delta t_{OUT}$ can be achieved at the remote ends based on appropriate choice of the value $\Delta t_{IN}$ supplied to the delay circuitry. The signal generator (or the central unit that includes the signal generator) may provide a user interface through which a user may enter the desired value $\Delta t_{OUT}$.

(4) Transmit the speedy delivery pulses $P_A$ and $P_B$ respectively onto cable A and cable B so that the time of transmission of the pulse onto cable B is delayed by $\Delta t_{IN}$ with respect to the time of transmission of the pulse onto cable A. The pulses $P_A$ and $P_B$, as applied to the inputs (i.e., the local ends) of the cables, are referred to as cable input trigger signals (CITSs). Because step (4) uses the same speedy delivery pulses $P_A$ and $P_B$ as used in the time-of-flight measurements (1) and (2), each pulse travels with the same velocity as it did during the corresponding time of flight measurement. Thus, the application of the pulses with input delay $\Delta t_{IN}$ will therefore ensure that the desired output delay $\Delta t_{OUT}$ will be achieved when the pulses $P_A$ and $P_B$ arrive respectively at the remote end of cable A and the remote end of cable B. The pulses that emerge from the remote ends (i.e., the output ends) of the cables are referred to as cable output trigger signals. The term "trigger signal" is meant to suggest the role of these signals in triggering actions at the remote units.

Prior to step (4), the remote end of cable A may be coupled to the first remote unit, and the remote end of cable B may be coupled to the second remote unit. The pulse $P_A$ arriving at the remote end of cable A may be used to trigger the first remote unit to start performing a first measurement and/or control process. The pulse $P_B$ arriving at the remote end of the cable B may be used to trigger the second remote unit to start performing a second measurement and/or control process.

As described above, the input delay is achieved by supplying the delay circuitry of the signal generator with the value $\Delta t_{IN}$.

If the input delay $\Delta t_{IN}$ is negative, the signal generator delays the generation of the pulse $P_A$ on generator channel A by positive delay $|\Delta t_{IN}|$ relative to the generation of the pulse $P_B$ on generator channel B. In other words, the signal generator transmits the pulse $P_A$ onto cable A with delay $|\Delta t_{IN}|$ after pulse $P_B$ is transmitted onto cable B.

In some embodiments, the above-described method may solve the problem of starting (or signaling) spatially-distributed remote devices or processes at the same time, or with controlled time delay.

In some embodiments, the above-described method may enable super high resolution of timing measurement and synchronization (or controlled asynchronization) of pulse arrivals, even in lossy media, and even in media where Heaviside's condition for transmission line parameters (R, L, C and G) is not satisfied. Heaviside's condition is the condition RC=LG.

In some embodiments, the above-described method may enable sub-nanosecond resolution of timing measurement and synchronization (or controlled asynchronization) of pulse arrivals.

The above-described method naturally generalizes to N cables, where N is greater than or equal to two. For each cable $C_k$ of the N cables, measure a respective round-trip time of flight measurement $TOF_k$ for the cable $C_k$ using a respective speedy delivery pulse $P_k$. Furthermore, for each cable $C_k$ other than a reference cable $C_1$, compute an input time delay $\Delta t_{IN}^{(k)}$ for the cable $C_k$ relative to the reference cable $C_1$ that would be required to achieve a desired output time delay $\Delta t_{OUT}^{(k)}$ for the cable $C_k$ relative to the reference cable. Finally, the pulses $P_1, P_2, \ldots, P_N$ are transmitted so that the delay of each pulse $P_k$, $k \neq 1$, relative to the pulse $P_1$ equals the computed input time delay $\Delta t_{IN}(k)$. To the extent that any of the input time delays $\Delta t_{IN}^{(k)}$ are negative, the indexing of the cable may be permuted so that all the input time delays are positive relative to a new reference cable.

BRIEF DESCRIPTION OF THE DRAWINGS

A better understanding of the present invention can be obtained when the following detailed description of the preferred embodiments is considered in conjunction with the following drawings.

FIG. 1 shows an SD waveform propagation test configuration, wherein three twisted-wire pairs in a 2 km POTS cable are coupled in series. FIGS. 2-5 show respective measured signals at various points along the 6 km test configuration.

FIG. 2 shows an SD waveform applied to the input of the 6 km test configuration, using an SD pulse generator. The logarithm of the input SD waveform is also shown.

FIG. 3 shows an SD waveform measured at 2 km, i.e., at the end of first 2 km section. The logarithm of the measured SD waveform is also shown.

FIG. 4 shows an SD waveform measured at 4 km, i.e., at the end of the second 2 km section. The logarithm of the measured SD waveform is also shown.

FIG. 5 shows an SD Waveform measured at 6 km, i.e., at the end of the third 2 km section. The logarithm of the measured SD waveform is also shown.

FIG. 6 shows: an SD pulse (at left) that was applied as the input to an RG-58/U coaxial cable of length ~100 m; and the SD pulse (at right) after having made an approximately 200 m roundtrip traversal of the cable, including a reflection off the distal end of the cable.

FIG. 7 shows a copy of FIG. 6, which has been supplemented with a time-shifted version of the input SD pulse, wherein the time shift has been selected to demonstrate the preservation of shape of the exponential leading edge of the SD pulse.

FIG. 8 illustrates a method for accurately determining the SD Pulse Delay between the leading edge of the input SD pulse and the return SD pulse by averaging a plurality of time-of-flight values. The time-of-flight values are associated with respective amplitude values that span at least a portion of the amplitude range of the leading edge of the return SD pulse. Each time-of-flight value is a time difference between a time when the leading edge of the input SD pulse crosses the associated amplitude value and a time when the leading edge of the return SD pulse crosses the associated amplitude value.

FIG. 9 shows an enhanced-TDR laboratory setup for measuring the two-way time of flight on a cable, wherein the setup includes: an arbitrary waveform generator for generating the input SD pulse; a scope for measuring the input SD pulse and the return SD pulse; and a computer for performing computations.

FIG. 10 shows a laboratory setup for performing enhanced-TDR measurements on two cables, and for subsequent time synchronization (or controlled asynchronization) of SD signals at the output ends of the two cables. The laboratory setup also includes an oscilloscope to measure delay between the SD signal output from the first cable and the SD signal output from the second cable.

FIG. 11 is a graph of average measured relative delay between the cable output trigger signals (COTSs) vs. the target delay. The average is over 100 measurements of the output delay.

FIG. 12 is a graph of target delay error, i.e., the difference between the average measured delay and the target delay, as a function of target delay.

FIG. 13 illustrates one embodiment of a method for synchronizing (or controllably asynchronizing) the arrival of speedy delivery pulses at the destination ends (remote ends) of cables.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporations by Reference

The following patents are hereby incorporated by reference in their entireties as though fully and completely set forth herein.

U.S. Pat. No. 6,441,695, filed on Mar. 7, 2000, entitled "Methods for Transmitting a Waveform Having a Controllable Attenuation and Propagation Velocity", invented by Robert H. Flake;

U.S. Pat. No. 6,847,267, filed on Aug. 20, 2002, "Methods for Transmitting a Waveform Having a Controllable Attenuation and Propagation Velocity", invented by Robert H. Flake and John F. Biskup;

U.S. Pat. No. 7,375,602, filed on Dec. 10, 2004, entitled "Methods for Propagating a Non Sinusoidal Signal Without Distortion in Dispersive Lossy Media", invented by Robert H. Flake, John F. Biskup, and Su-liang Liao;

U.S. Pat. No. 7,859,271, filed on Mar. 26, 2008, entitled "Methods for Propagating a Non Sinusoidal Signal Without Distortion in Dispersive Lossy Media", invented by Robert H. Flake and John F. Biskup;

U.S. Pat. No. 8,093,911, filed on Oct. 26, 2010, entitled "Time-of-Flight Measurement Based on Transfer Function and Simulated Exponential Stimulus", invented by Robert H. Flake, John F. Biskup, and Su-liang Liao;

U.S. Pat. No. 8,867,657, filed on Feb. 17, 2014, entitled "Communication Using Analog Pulses Having Exponentially-Shaped Leading Edges", invented by Robert H. Flake; and U.S. Pat. No. 8,923,444, filed on Jun. 30, 2014, entitled "Decoding a Communication Signal That Contains Analog Pulses with Exponentially-Shaped Leading Edge.

I. NOMENCLATURE

ARB: Arbitrary Waveform Generator
CITS: Cable Input Trigger Signal
COTS: Cable Output Trigger Signal
DPO: Digital Phosphor Oscilloscope
e-TDR: Enhanced Resolution TDR
EL: Electrical Length
$\mu$: Mean
POTS: Plain Old Telephone Service
TSCAS: Time Synchronization and Controlled Asynchronization System
sd: Standard Deviation
SD: Speed Delivery, Waveform
Slowness: Inverse Velocity
TDR: Time Domain Reflectometer
TDL: Time Domain Latency
TOF: Time of Flight
VI: Virtual Instrument

Terminology

A memory medium is a non-transitory medium configured for the storage and retrieval of information. Examples of memory media include: various kinds of semiconductor-based memory such as RAM and ROM; various kinds of magnetic media such as magnetic disk, tape, strip and film; various kinds of optical media such as CD-ROM and DVD-ROM; various media based on the storage of electrical charge and/or any of a wide variety of other physical quantities; media fabricated using various lithographic techniques; etc. The term "memory medium" includes within its scope of meaning the possibility that a given memory medium might be a union of two or more memory media that reside at different locations, e.g., on different chips in a system or on different computers in a network. In some embodiments, a memory medium may be a flash memory.

A non-transitory memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

A computer system is any device (or combination of devices) having at least one processor that is configured to execute program instructions stored on a memory medium. Examples of computer systems include personal computers (PCs), workstations, laptop computers, tablet computers, mainframe computers, server computers, client computers, network or Internet appliances, hand-held devices, mobile devices, personal digital assistants (PDAs), tablet computers, computer-based television systems, grid computing systems, wearable devices, computers implanted in living organisms, computers embedded in head-mounted displays, computers embedded in sensors forming a distributed network, etc.

A programmable hardware element (PHE) is a hardware device that includes multiple programmable function blocks connected via a system of programmable interconnects. Examples of PHEs include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores).

In some embodiments, a computer system may be configured to include a processor (or a set of processors) and a memory medium, where the memory medium stores program instructions, where the processor is configured to read and execute the program instructions stored in the memory medium, where the program instructions are executable by the processor to implement a method, e.g., any of the various method embodiments described herein, or, any combination of the method embodiments described herein, or, any subset of any of the method embodiments described herein, or, any combination of such subsets.

This patent discloses among other things recent advances in resolution of the time synchronization and controlled asynchronization (TSCA) of remote analog signals, i.e., cable output trigger signals (COTSs).

As a particular example, TDR measurements on a pair of cables of different lengths (i.e., ~150 m and ~300 m) were made in order to synchronize the cable output trigger signals with sub-nanosecond resolution. As another example, the cable output trigger signals from these cables were asynchronized with the same resolution, to target values ranging from −3000 ns to +3000 ns. This synchronization and asynchronization was accomplished by controlling the relative delay of the cable input trigger signals, when generated by a dual-channel Arbitrary Function Generator. The advancement in resolution was achieved using a highly enhanced resolution Time Domain Reflectometer (e-TDR), having the capability to accurately control the speed of the e-TDR signal in the cables. This advance in resolution was obtained because a recently discovered signal, that has the property of distortionless propagation in lossy cables, was used as the e-TDR pulse. The system was implemented as a Virtual Instrument (VI) in LabVIEW, using a two-channel Arbitrary Waveform Generator (ARB) and a Digital Phosphor Oscilloscope (DPO). The resulting errors were less than +/−0.26 ns.

II. INTRODUCTION

The quality of the time synchronization and controlled asynchronization results in this paper were dependent on the resolution of electrical length (EL) measurements on the two cables. (The electrical length of a cable is the time it takes for a signal to travel from end to end within the cable). These measurements were made with our e-TDR. (This high resolution TDR has been referred to as an enhanced-TDR (e-TDR), a term coined in a patented industrial application [1].

The high resolution of the our e-TDR was achieved by the utilization of a non-dispersive pulse, called Speed Delivery (SD), which, despite attenuation, maintains its shape and propagation velocity, while measuring EL of lossy cables.

No other TDR technology currently utilizes a nondispersive pulse to enhance its resolution. However, there are three approaches for implementing non-dispersive, or distortionless, pulses.

The first type of pulse consists of a burst of a single frequency sinusoid, such as that used in all frequency response measurements. A network analyzer is an example of an instrument that uses bursts of single frequency sinusoids.

The second type of distortionless propagation of a signal was obtained by Oliver Heaviside (1850-1925) in his 1887 discovery of distortionless circuits (lossy transmission lines) [2]. This technology required a constraint on the primary transmission line parameters:

$$RC = GL \quad (1)$$

where R is resistance per unit length; L is inductance per unit length; C is capacitance per unit length; and G is conductance per unit length.

This constraint was achieved by periodically placing "loading coils" in a Plain Old Telephone Systems (POTS) line, and is still used on analog telephone links today, allowing distortionless transmission throughout the voice band, from zero to three kilohertz.

There is a third way to produce a propagating, nondispersive signal in a lossy transmission line, without Heaviside's constraint on the transmission line parameters. A pulse called Speedy Delivery (SD) is a non-sinusoidal, nonperiodic waveform with a leading edge that is a positive exponential function of time ($D*e^{\alpha t}$), truncated at finite amplitude, and followed by a return to zero (e.g., a linear return to zero). When this waveform is applied to the input of a lossy transmission line, the propagating leading edge of the signal retains its characteristics of being non-dispersive and having constant propagation velocity.

III. ILLUSTRATION OF THE PROPAGATION OF A NONDISPERSIVE SD SIGNAL ON 6 KM OF POTS

To illustrate the non-dispersive properties of the SD waveform, an arbitrary waveform generator (ARB), shown in FIG. 1, was used to produce the SD pulse, and FIGS. 2 through 5 illustrate the non-dispersive behavior of the leading edge of SD pulse, while traveling along a test configuration comprising three series-connected twisted wire pairs within an approximately 2 km POTS cable [3]. Each section (i.e., twisted wire pair) was approximately two kilometers in length. Thus, the test configuration was approximately 6 km in length. The three sections are denoted the blue-purple section, the green-yellow section and the black-grey section.

The left hand portion of FIG. 2 shows the SD voltage pulse (whose leading edge is of the form $D*e^{\alpha t}$) that was applied as input to the test configuration. The left hand portions of FIGS. 3 through 5 show the SD pulse at respective measurement points along the test configuration, i.e., after propagation through 2 km, 4 km and 6 km of the test configuration, respectively.

The right hand portion in each of FIGS. 2 through 5 shows the natural logarithm of the corresponding SD pulse in the left hand portion. The right hand portions of FIGS. 2 through 5 confirm that the leading edge of SD pulse preserve its exponential shape as it propagates through the test configuration. Note that the natural log of $\exp(\alpha*t)$ is $\alpha*t$, which is a line of constant slope $\alpha$.

No repeater circuits were used to boost the SD pulse between the successive sections of the test configuration. Thus, the peak of the SD pulse attenuated with distance traveled, as expected, but the exponential shape of the rising edge was preserved, even though the attenuation of the SD pulse amplitude at 6 km was ~42 dB, as shown in the left hand portion of FIG. 5.

IV. THE SD SIGNAL DELAY MEASURED ON COAXIAL CABLES WITH OUR E-TDR

Referring to FIG. 6, an SD pulse was applied to one end (the "transmission end") of an RG-58/U coaxial cable, having a length of ~100 m. This input SD pulse was measured at the transmission end, and is shown at the left of FIG. 6. The opposite end (the "remote end") had 1 MegaOhm termination. When the SD pulse arrived at this 1 MegaOhm termination, a reflected waveform was returned to the transmission end. The return waveform, having made an approximately 200 m round trip through the cable, was measured at the transmission end. The return waveform appeared as the second pulse (at the right) on the e-TDR scan of the digital phosphor oscilloscope (DPO).

FIG. 7 illustrates a time-shifted version of the input SD pulse that is superimposed on the SD return waveform, and demonstrated that the SD return waveform had the same exponentially-shaped rising edge as the input SD pulse. In other words, the rising edge of the input SD pulse preserved its exponential shape in the return pulse, while the trailing part of the signal became distorted.

In some embodiments, an accurate time-of-flight (TOF) between a transmitted SD pulse and a return SD pulse may be computed by averaging a plurality of amplitude-specific TOF values. Having captured (e.g., using a digital oscilloscope) a set of samples representing the transmitted SD pulse and a set of samples representing the return SD pulse, a computer may compute a time separation value $\Delta(A_i)$ for each amplitude $A_i$ in a set of amplitudes $$\{A_i : i=1, 2, \ldots, N\}.$$

The set of amplitudes may be designed to span at least a portion of the amplitude range of the leading edge of the return SD pulse. Each separation value $\Delta(A_i)$ is a measure of the time separation between (a) the time at which the leading edge of the transmitted SD pulse crosses the amplitude $A_i$ and (b) the time at which the leading edge of the return SD pulse crosses the amplitude $A_i$. Because the leading edge of the return SD pulse has the same shape as the leading edge of the transmitted SD pulse, the time separation values $\Delta(A_i)$, i=1, 2, . . . , N, are nominally equal except for noise variations. Thus, a more accurate estimate of the time of flight may be determined by averaging the computed separation values $\Delta(A_i)$, i=1, 2, . . . , N.

Referring to FIG. 8, a method for determining an accurate time of flight between an applied SD signal and a reflected SD signal is shown. The method is illustrated in terms of a specific waveforms captured using an RG-58/U Coaxial Cable. (However, the method naturally generalized to any type or length of cable.) For each of a plurality of threshold voltages, we determined a corresponding time of flight (TOF) between the time when the leading edge of applied SD signal crossed the threshold voltage and the time when the leading edge of the reflected SD signal crossed the threshold voltage. These threshold-specific TOF values can be averaged to obtain a very precise measurement of TOF, e.g., using our e-TDR.

The e-TDR Virtual Instrument (VI) running in LabVIEW was developed at UT Austin. FIG. 8 illustrates the time of flight (TOF) measurement of the SD input and output waveforms, using 200 threshold levels on the pulse pair, between 0.15V and 0.45V. For example, at 0.15 Volts, the time of flight was determined to be 959.1xx nsec, where the xx denotes successive lower order digits (i.e., digits of order lower than tenths of nanoseconds). As another example, at 0.45 Volts, the time of flight was again determined to be 959.1xx nsec. The lower order digits xx vary from one threshold to the next. However, all the threshold-specific TOF values agreed down to the tenths of nanoseconds. We used an input SD pulse with an amplitude of 1 V, and an exponential coefficient value $\alpha=1E7$ sec$^{-1}$ for all the measurements in FIG. 8. The VI program used the acquired data to calculate the mean of these 200 measurements, to achieve enhanced precision of the two-way TOF of the e-TDR signal. These measurements had very small variations because the time differences of the leading edges at each voltage level were nearly identical, since the leading edge shapes were nearly identical, e.g. non-distorted.

V. SETUP AND PROCEDURE FOR AN E-TDR MEASUREMENT OF THE ELECTRICAL LENGTH OF RG-58/U COAXIAL CABLES

FIG. 9 shows the e-TDR laboratory setup used for the two-way TOF measurements on a ~100 m RG-58/U coaxial cable. The LabVIEW VI (virtual instrument) controlled a Tektronix, AFG3102, dual channel, Arbitrary Function Generator (ARB) to generate the exponential rising edge of the SD pulse signals, at a repetition rate slower than the time for the pulse to propagate down the cable and its reflection to return.

Table 1 (below) summarizes some of the timing specifications of the AFG3102 (ARB) and DPO4054 (DPO). Both channels of the ARB had programmable trigger delays, with 0.1 ns resolution, and some jitter. The VI acquired waveform measurements using a Tektronix, Digital Phosphor Oscilloscope 4054 (DPO). The DPO digitized at 2.5 GS/s, with a timing jitter of 0.2 ns. (GS is an acronym for Gigasamples.) While some of these specifications may affect system resolution, a rigorous analysis has not yet been performed.

TABLE 1

RELEVANT SPECIFICATIONS OF THE EQUIPMENT USED.

| Specification | AFG3102 (ARB) | DPO 4054 (DPO) | Units |
| --- | --- | --- | --- |
| Sample Rate (max) | 1 | 2.5 | GS/s |
| Sample Rate (used) | 0.25 | 2.5 | GS/s |
| Amplitude Resolution | 14 | 16 | bits |
| Bandwidth (−3 dB) | 100 | 500 | MHz |
| Rise Time | <5 | 0.7 | ns |
| Jitter, Signal at sample rate used (typical) | 4 | | ns |
| Jitter, Trigger Output | 0.2 | | ns (rms) |
| Channel-to-Channel Skew | | 0.2 | ns (rms) |
| Time Accuracy (over 1 ms) | | +/−5 | ppm |

VI. LABORATORY SETUP AND PROCEDURE FOR TIME SYNCHRONIZATION AND CONTROLLED ASYNCHRONIZATION SYSTEM (TSCAS) MEASUREMENTS

FIG. 10 shows the laboratory setup of the e-TDR used for Time Synchronization and Controlled Asynchronization System (TSCAS) measurements. This setup included two coils of RG-58/U coaxial cable: Coil-I was ~150 m, and Coil-II was ~300 m. We compensated for the skew between these two cables by delaying the ARB channel that was connected to the shorter of the two cables, so that the cable output trigger signals would appear at the same time at the output ends of the two coils. (Note that in operational mode, the output ends of the cables would typically be spatially separated, not coupled to a scope for outputs measurements as shown FIG. 10. Indeed, in operational mode, the output ends would typically be located wherever the remote units are located. The output ends would be coupled to those remote units so that they could be triggered by the cable output trigger signals.)

The first step was to perform e-TDR measurements on each of these two coils, to obtain their two-way TOF. We used an SD pulse with an amplitude of 10V, and $\alpha=5\times10^7$ sec$^{-1}$ for all the measurements in this experiment. We used the mean of the 100 two-way, e-TDR measurements to compute the two-way TOF. Because the SD pulses travel at a constant propagation velocity, one half of the cable's e-TDR TOF is equal to the electrical length (EL) of the cable. The mean of 100 measured ELs of each cable was determined.

The mean TOF for 100 e-TDR measurements of Coil-I was 1437.398 ns, with a standard deviation of 0.009 ns. The mean TOF for 100 e-TDR measurements of Coil-II was 2795.937 ns, with a standard deviation of 0.032 ns.

In order to synchronize the cable output trigger signals at the outputs of the two cables, we wished to nullify the mean cable-to-cable EL skew. The ARB used was capable of generating an independent trigger delay to both channels generating the SD pulses (i.e., the cable input trigger signals). In effect, the SD pulse fed at the input end of the shorter coil (Coil-I) would be delayed, such that the SD pulses arrived simultaneously at the output ends of both cables. While our e-TDR setup computes EL to 0.001 ns, the Tektronix AFG3102 was only capable of producing a trigger delay with a resolution of 0.1 ns. Thus, any trigger delay entered with a higher resolution than 0.1 ns was rounded accordingly to the nearest 0.1 ns.

The mean EL of Coil-I was 718.670 ns, and the mean EL of Coil-II was 1398.002, giving a mean cable-to-cable EL skew of 679.333 ns.

To synchronize the two cable output trigger signals (COTSs), we wished to apply a trigger delay of 679.333 ns to the ARB channel that was the input to the shorter coil (Coil-I). However, when we entered this amount into the ARB channel trigger, this delay was rounded to 679.3 ns, and introduced a quantization error into potential resolution of the skew compensation. The measured difference between the mean EL's of the two cables was 0.239 ns, with a standard deviation of 0.009 ns.

Now that we had successfully synchronized the cable output triggers signals, we wanted to demonstrate the ability to asynchronize the cable output trigger signals by an arbitrary amount. Suppose we had a measured EL skew of 500.343 ns, and we wanted to produce a cable-to-cable asynchronization EL skew of 1234.567 ns. We would first determine which ARB input to a coil needed to be delayed. Intuitively, if we needed to increase the cable EL skew from the existing EL cable skew, we would delay the trigger of the ARB input to the longer cable. Conversely, if we wanted to decrease the cable EL skew from the existing cable EL skew, then we would delay the trigger of the ARB input to the shorter cable. In this case of programming a cable-to-cable EL skew of 1234.567 ns, we would delay the trigger to the ARB input to the longer cable, Coil-II, by 734.224 ns.

Again, we would observe that when we entered 734.224 ns as the trigger delay to the ARB, this number was rounded down by the ARB to 734.2 ns, thus the quantization error reduced the potential resolution of the skew measurements.

VII. SETUP AND PROCEDURE FOR EVALUATING THE VI FOR TIME SYNCHRONIZATION AND CONTROLLED ASYNCHRONIZATION OF TWO REMOTE SIGNALS

In our laboratory setup, the two cables were on spools, allowing direct access of the VI to the output ends of the two coils. Therefore, we were able to measure the resolution of the synchronization of the cable output triggers signals achieved on the two circuits. Time synchronization or controlled asynchronization of the cable output trigger signals was evaluated by measuring the difference in latency between the cable output trigger signals from the two cables, using two channels of the DPO in the lower right hand corner of FIG. 10.

For a differential latency measurement (TDT), we set one DPO channel (ch2) to acquire the cable output trigger signal of Coil-I, and another DPO channel (ch4) to acquire the cable output trigger signal of Coil-II. The TOF difference of the two cable output trigger signals was measured using the same VI program, as the e-TDR measurements.

In a real-world application, we could expect the cable outputs of multiple remote output signals to be in different locations. For example, for the Coil-I and Coil-II in our setup, the maximum separation of the cable outputs is ~450 m. In this case, we would not have direct measurement access to the output ends of these cables, to evaluate the synchronization. However, we would perform e-TDR EL measurements on the individual cables that we wanted to synchronize, to obtain an estimate of the cable-skews and delay the faster signals by these 'skew' amounts, to synchronize the cable output trigger signals. In addition, we could asynchronize the cable output trigger signals by adjusting the EL skew values programmed into the ARB channel trigger delays, as described in section VI. Using this procedure, we could achieve synchronization or asynchronization of the cable output trigger signals, even though we could not directly verify the results.

VIII. EXPERIMENTAL RESULTS OF TIME SYNCHRONIZATION AND CONTROLLED ASYNCHRONIZATION

Using the lab setup in FIG. 10, we both synchronized the cable output trigger signals at the outputs of Coil-I and Coil-II, as well as, asynchronized the cable output trigger signals the outputs of Coil-I and Coil-II, over a range of −3000 ns to +3000 ns, with a step size of 250 ns. The measured EL skew was 679.333 ns. Therefore, the ARB channel trigger delay rounded down to 679.3 ns.

To implement the range of −3000 ns to +3000 ns, only one ARB channel was incremented in 250 ns steps, while the other ARB channel had a fixed offset delay programmed to shift from the measured skew to the maximum desired skew of +3000 ns. Therefore, ARB CH2 was shifted by 2320.7 ns. Then, to cover the range from −3000 ns to +3000 ns, we increased the delay on ARB CH1 in step sizes of 250 ns, until we achieved the final target value of +3000 ns.

Table 2 indicates the delay values that were programmed into the two ARB channels. FIG. 11 shows a graph of the average measured delay between the cable output trigger signals vs. the target delay between the cable output trigger signals. We define the delay error as the difference between the average measured delay and the target delay. The delay error vs. programmed delay is shown in FIG. 12.

TABLE 2

Target Delays of the Cable Output Trigger Signals (COTSs)

| Measured Cable Latency Skew | 679.333 ns |
|---|---|
| ARB Programmable Latency Skew | 679.300 ns |
| ARB Ch2 Programmed Delay | 2320.700 ns |
| Target Delay (ns) | ARB Ch1 Delay (ns) |
| 3000 | 0 |
| 2750 | 250 |
| 2500 | 500 |
| 2000 | 1000 |
| 1750 | 1250 |
| 1500 | 1500 |
| 1250 | 1750 |
| 1000 | 2000 |
| 750 | 2250 |
| 500 | 2500 |
| 250 | 2750 |
| 0 | 3000 |
| 250 | 3250 |
| −500 | 3500 |
| −750 | 3750 |
| −1000 | 4000 |
| −1250 | 4250 |
| −1500 | 4500 |
| −1750 | 4750 |
| −2000 | 5000 |
| −2250 | 5250 |
| −2500 | 5500 |
| −2750 | 5750 |
| −3000 | 6000 |

FIG. 11 shows the average measured delay (averaged over 100 measurements) between the cable output trigger signals vs. the target delay between the cable output trigger signals. FIG. 12 is a graph of asynchronization error vs. target delay, wherein the asynchronization error is the difference between the average measured delay and the target delay.

IX. CONCLUSIONS

Time synchronization and controlled asynchronization of cable output trigger signals with sub-nanosecond resolution has been demonstrated for a pair of cables with their output ends potentially being ~450 m distance apart. The sub-nanosecond resolution achieved was possible using our e-TDR. Measurements of synchronization and asynchronization of the cable output trigger signals were conducted over a range of −3000 ns to +3000 ns, and the signals were synchronized/asynchronized to within +/−0.260 ns. e-TDR technology is capable of achieving high precision because it employs the Speedy Delivery (SD) signal, which is a non-sinusoidal, non-periodic waveform, which propagates in a lossy transmission line, without dispersion, and with a constant velocity. (The constant velocity depends on the value of the exponential coefficient $\alpha$.)

The EL of RU-58/U cables was measured to sub-nanosecond resolution, but the physical length of the cables was only approximate. Slowness (inverse of velocity) is defined as EL divided by the physical length (ns/m). The estimated value of slowness for Coil-I was 4.791 ns/m, therefore, an error of 0.26 ns is equivalent to having the SD signal travel ~5.6 cm in the Coil-I. The estimated value of slowness for Coil-II was 4.660 ns/m; therefore, an error of 0.26 ns is equivalent to having the SD signal travel ~5.4 cm in the Coil-II.

We believe the timing synchronization resolution offered by this technology has the potential for significant improvement of a wide variety of applications. One such application may be the acquisition of seismic data with long, towed arrays over deep water, which have lengths comparable to logging cables [4].

X. REFERENCES

[1] U.S. Provisional Application 60/773,546, filed on Feb. 15, 2006, and U.S. Pat. No. 8,269,647, issued Sep. 18, 2012, titled "Well Depth Measurement Using Time Domain Reflectometry".

[2] Kenneth R. Demarest, Engineering Electromagnetics, New Jersey, Prentice Hall, Inc, 1998, pp 362-364.

[3] R. H. Flake and J. F. Biskup, "Part II (Experiments) Signal Propagation without Distortion on Lossy Transmission Lines Having Frequency Dependent Parameters", 9th IEEE workshop on signal propagation on interconnects, pp. 43-54, May 2005, ISBN 0-7803-9054-7.

[4] "Time Synchronization of signals is critical to seismic data acquisition", Dr. Bob A. Hardage, Past President of the Society of Exploration Geophysicists.

In one set of embodiments, a method 1300 may include the operations shown in FIG. 13 or any subset of those operations. (The method 1300 may also include any subset of the elements, embodiments and features described above in connection with FIGS. 1-12.)

At 1310, the method may include performing time of flight measurements using time-domain reflectometry (TDR) circuitry. The action of performing time of flight measurements may include: measuring a round-trip time of flight $TOF_1$ for a first pulse that is transmitted onto a first cable at a first end of the first cable, wherein the first pulse has a leading edge with exponential shape; and measuring a round-trip time of flight $TOF_2$ for a second pulse that is transmitted onto a second cable at a first end of the second cable, wherein the second pulse has a leading edge with exponential shape.

At 1320, the method may include determining time delay information. The action of determining time delay information may include computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$.

At 1330, the method may include performing pulse transmission according to the time delay information. The pulse transmission may include: transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

In some embodiments, the action of computing the input time delay $\Delta t_{IN}$ between the two pulses is performed according to the relation:

$$\Delta t_{IN} = (TOF_1/2) - (TOF_2/2) + \Delta t_{OUT}.$$

In some embodiments, the exponential shape of the leading edge of the first pulse and the exponential shape of the leading edge of the second pulse have the same exponential coefficient value.

In some embodiments, $\Delta t_{OUT}$ is set equal to zero. This equality to zero represents the case where the user desires the first pulse and second pulse to arrive the second ends (i.e., the remote ends) at the same time, i.e., in synchronized fashion. (The term "controlled asynchronization" is used in the case where the $\Delta t_{OUT}$ is set to a nonzero value.)

In some embodiments, the second end of the first cable is coupled to a first remote unit, wherein the second end of the second cable is coupled to a second remote unit, wherein the arrival of the first pulse at the second end of the first cable causes the first remote unit to initiate a first measurement and/or control process, wherein the arrival of the second pulse at the second end of the second cable causes the second remote unit to initiate a second measurement and/or control process.

In some embodiments, the first measurement and/or control process includes one or more of the following:
- transmission of one or more wireless signals;
- reception of one or more wireless signals;
- transmission of one or more electrical signals onto one or more output buses;
- reception of one or more electrical signals from one or more input buses;
- submission of one or more financial transaction requests to one or more markets;
- transmission of data onto one or more computer networks;
- acquisition of samples by one or more A/D converters;
- conversion of samples into analog form by one or more D/A converters;
- activation of one or more mechanical actuators;
- activation of one or more sensors;
- acquisition of measurements from one or more measurement devices;
- turning on power to one or more lasers;
- starting one or more engines;
- starting one or more heaters;
- initiating or changing flow through one or more dams.

In some embodiments, the second measurement and/or control process includes one or more of the following:
- transmission of one or more wireless signals;
- reception of one or more wireless signals;
- transmission of one or more electrical signals onto one or more output buses;
- reception of one or more electrical signals from one or more input buses;
- submission of one or more financial transaction requests to one or more markets;
- transmission of data onto one or more computer networks;
- acquisition of samples by one or more A/D converters;
- conversion of samples into analog form by one or more D/A converters;
- activation of one or more mechanical actuators;
- activation of one or more sensors;
- acquisition of measurements from one or more measurement devices;
- turning on power to one or more lasers;
- starting one or more engines;
- starting one or more heaters;
- initiating or changing flow through one or more dams.

In some embodiments, the first remote unit and/or the second remote unit may be devices related to the exploration and/or production of hydrocarbons. For example, the remote units may be devices deployed in one or more wells, wherein the above-mentioned cables extend to the remote units from a central controlling unit at the surface. (The central controlling unit may include the circuitry for performing steps 1310-1330.) The remote units may be include, e.g., measurements devices, actuators, geophones, etc.

In some embodiments, the cables are at least partially deployed into one or more wells.

In some embodiments, the first cable is longer then the second cable, wherein an exponential coefficient of the leading edge of the first pulse is positive and smaller than an exponential coefficient of the leading edge of the second pulse.

In some embodiments, the method may operate on more than two cables, as follows. The above-described action of performing time of flight measurements may also include measuring a round-trip time of flight $TOF_3$ for a third pulse that is transmitted onto a third cable at a first end of the third cable, wherein the third pulse has a leading edge with exponential shape. Furthermore, the above-described action of determining time delay information may also include computing an input time delay $\Delta t_{IN}^{(3)}$ between the time of transmission of the first pulse onto the first cable at the first end of the first cable and a time of transmission of the third pulse onto the third cable at the first end of the third cable that would produce a desired output time delay $\Delta t_{OUT}^{(3)}$ between the arrival time of the first pulse at the second end of the first cable and an arrival time of the third pulse at a second end of the third cable. The input time delay $\Delta t_{IN}^{(3)}$ is computed based on the round-trip time of flight $TOF_1$, the round-trip time of flight $TOF_3$ and the desired output time delay $\Delta t_{OUT}^{(3)}$. Yet further, the above-described pulse transmission may also include transmitting the third pulse onto the third cable at the first end of the third cable so that the time of transmission of the third pulse onto third cable is delayed by the input time delay $\Delta t_{IN}^{(3)}$ with respect to the time of transmission of the first pulse onto the first cable.

In one set of embodiments, a system may include time domain reflectometry (TDR) circuitry, computing circuitry and transmission circuitry. The system may also include any subset of the features, elements and embodiments described above in connection with FIGS. 1-13.

The time domain reflectometry (TDR) circuitry may be configured to perform time of flight measurements. The action of performing time of flight measurements may include: measuring a round-trip time of flight $TOF_1$ for a first pulse that is transmitted onto a first cable at a first end of the first cable, wherein the first pulse has a leading edge with exponential shape; and measuring a round-trip time of flight $TOF_2$ for a second pulse that is transmitted onto a second cable at a first end of the second cable, wherein the second pulse has a leading edge with exponential shape.

The computing circuitry may be configured to determine time delay information. The computing circuitry may be realized by a computer, by a programmable hardware elements such as an FPGA, by dedicated digital circuitry (such as an ASIC), or by any combination of the foregoing. The action of determining time delay information may include computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$.

The transmission circuitry may be configured to perform pulse transmission according to the time delay information. The pulse transmission may include transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

In some embodiments, the TDR circuitry includes an arbitrary waveform generator, an oscilloscope and a computer.

In one set of embodiments, a non-transitory memory medium stores program instructions, wherein the program instructions, when executed by a computer, cause the computer to implement: (1) directing time-domain reflectometry circuitry to perform time of flight measurements, wherein said performing time of flight measurements includes: measuring a round-trip time of flight $TOF_1$ for a first pulse that is transmitted onto a first cable at a first end of the first cable, wherein the first pulse has a leading edge with exponential shape; and measuring a round-trip time of flight $TOF_2$ for a second pulse that is transmitted onto a second cable at a first end of the second cable, wherein the second pulse has a leading edge with exponential shape; (2) determining time delay information, wherein said determining time delay information includes computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$; and (3) directing signal generation circuitry to perform pulse transmission according to the time delay information, wherein said pulse transmission includes transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
   performing time of flight measurements using time-domain reflectometry (TDR) circuitry, wherein said performing time of flight measurements includes:
   measuring a round-trip time of flight $TOF_1$ for a first pulse that is transmitted onto a first cable at a first end of the first cable, wherein the first pulse has a leading edge with exponential shape; and
   measuring a round-trip time of flight $TOF_2$ for a second pulse that is transmitted onto a second cable at a first end of the second cable, wherein the second pulse has a leading edge with exponential shape;
   determining time delay information, wherein said determining time delay information includes:
   computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$; and
   performing pulse transmission according to the time delay information, wherein said pulse transmission includes:
   transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

2. The method of claim 1,
   wherein said performing time of flight measurements also includes:
   measuring a round-trip time of flight $TOF_3$ for a third pulse that is transmitted onto a third cable at a first end of the third cable, wherein the third pulse has a leading edge with exponential shape;
   wherein said determining time delay information also includes:
   computing an input time delay $\Delta t_{IN}^{(3)}$ between the time of transmission of the first pulse onto the first cable at the first end of the first cable and a time of transmission of the third pulse onto the third cable at the first end of the third cable that would produce a desired output time delay $\Delta t_{OUT}^{(3)}$ between the arrival time of the first pulse at the second end of the first cable and an arrival time of the third pulse at a second end of the third cable, wherein the input time delay $\Delta t_{IN}^{(3)}$ is computed based on the round-trip time of flight $TOF_1$, the round-trip time of flight $TOF_3$ and the desired output time delay $\Delta t_{OUT}^{(3)}$;
   wherein said pulse transmission also includes:
   transmitting the third pulse onto the third cable at the first end of the third cable so that the time of transmission of the third pulse onto third cable is delayed by the input time delay $\Delta t_{IN}^{(3)}$ with respect to the time of transmission of the first pulse onto the first cable.

3. The method of claim 1, wherein said computing the input time delay $\Delta t_{IN}$ between the two pulses is performed according to the relation:

$$\Delta t_{IN} = (TOF_1/2) - (TOF_2/2) + \Delta t_{OUT}.$$

4. The method of claim 1, wherein an exponential coefficient value of the exponential shape of the leading edge of the first pulse is equal to an exponential coefficient value of the exponential shape of the leading edge of the second pulse.

5. The method of claim 1, wherein $\Delta t_{OUT}$ is set equal to zero.

6. The method of claim 1, wherein the second end of the first cable is coupled to a first remote unit, wherein the second end of the second cable is coupled to a second remote unit, wherein the arrival of the first pulse at the second end of the first cable causes the first remote unit to initiate a first measurement and/or control process, wherein the arrival of the second pulse at the second end of the second cable causes the second remote unit to initiate a second measurement and/or control process.

7. The method of claim 6, wherein the first measurement and/or control process includes one or more of the following:
   transmission of one or more wireless signals;
   reception of one or more wireless signals;
   transmission of one or more electrical signals onto one or more output buses;

reception of one or more electrical signals from one or more input buses;
submission of one or more financial transaction requests to one or more markets;
transmission of data onto one or more computer networks;
acquisition of samples by one or more analog-to-digital converters;
conversion of samples into analog form by one or more digital-to-analog converters;
activation of one or more mechanical actuators;
activation of one or more sensors;
acquisition of measurements from one or more measurement devices;
turning on power to one or more lasers;
starting one or more engines;
starting one or more heaters;
initiating or changing flow through one or more dams.

8. The method of claim 6, wherein the second measurement and/or control process includes one or more of the following:
transmission of one or more wireless signals;
reception of one or more wireless signals;
transmission of one or more electrical signals onto one or more output buses;
reception of one or more electrical signals from one or more input buses;
submission of one or more financial transaction requests to one or more markets;
transmission of data onto one or more computer networks;
acquisition of samples by one or more analog-to-digital converters;
conversion of samples into analog form by one or more digital-to-analog converters;
activation of one or more mechanical actuators;
activation of one or more sensors;
acquisition of measurements from one or more measurement devices;
turning on power to one or more lasers;
starting one or more engines;
starting one or more heaters;
initiating or changing flow through one or more dams.

9. The method of claim 1, wherein the first cable is longer then the second cable, wherein an exponential coefficient of the leading edge of the first pulse is positive and smaller than an exponential coefficient of the leading edge of the second pulse.

10. A system comprising:
time domain reflectometry (TDR) circuitry configured to perform time of flight measurements, wherein said performing time of flight measurements includes:
measuring a round-trip time of flight $TOF_1$ for a first pulse that is transmitted onto a first cable at a first end of the first cable, wherein the first pulse has a leading edge with exponential shape; and
measuring a round-trip time of flight $TOF_2$ for a second pulse that is transmitted onto a second cable at a first end of the second cable, wherein the second pulse has a leading edge with exponential shape;
computing circuitry configured to determine time delay information, wherein said determining time delay information includes:
computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$; and
transmission circuitry configured to perform pulse transmission according to the time delay information, wherein said pulse transmission includes:
transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

11. The system of claim 10, wherein the TDR circuitry includes an arbitrary waveform generator, an oscilloscope and a computer.

12. The system of claim 10, wherein said performing time of flight measurements also includes:
measuring a round-trip time of flight $TOF_3$ for a third pulse that is transmitted onto a third cable at a first end of the third cable, wherein the third pulse has a leading edge with exponential shape;
wherein said determining time delay information also includes:
computing an input time delay $\Delta t_{IN}^{(3)}$ between the time of transmission of the first pulse onto the first cable at the first end of the first cable and a time of transmission of the third pulse onto the third cable at the first end of the third cable that would produce a desired output time delay $\Delta t_{OUT}^{(3)}$ between the arrival time of the first pulse at the second end of the first cable and an arrival time of the third pulse at a second end of the third cable, wherein the input time delay $\Delta t_{IN}^{(3)}$ is computed based on the round-trip time of flight $TOF_1$, the round-trip time of flight $TOF_3$ and the desired output time delay $\Delta t_{OUT}^{(3)}$;
wherein said pulse transmission also includes:
transmitting the third pulse onto the third cable at the first end of the third cable so that the time of transmission of the third pulse onto third cable is delayed by the input time delay $\Delta t_{IN}^{(3)}$ with respect to the time of transmission of the first pulse onto the first cable.

13. The system of claim 10, wherein said computing the input time delay $\Delta t_{IN}$ between the two pulses is performed according to the relation:

$$\Delta t_{IN} = (TOF_1/2) - (TOF_2/2) + \Delta t_{OUT}.$$

14. The system of claim 10, wherein an exponential coefficient value of the exponential shape of the leading edge of the first pulse is equal to an exponential coefficient value of the exponential shape of the leading edge of the second pulse.

15. The system of claim 10, wherein $\Delta t_{OUT}$ is set equal to zero.

16. The system of claim 10, wherein the second end of the first cable is coupled to a first remote unit, wherein the second end of the second cable is coupled to a second remote unit, wherein the first remote unit is configured so that the arrival of the first pulse at the second end of the first cable causes the first remote unit to initiate a first measurement and/or control process, wherein the second remote unit is configured so that the arrival of the second pulse at the second end of the second cable causes the second remote unit to initiate a second measurement and/or control process.

17. The system of claim 16, wherein the first measurement and/or control process includes one or more of the following:
transmission of one or more wireless signals;

reception of one or more wireless signals;
transmission of one or more electrical signals onto one or more output buses;
reception of one or more electrical signals from one or more input buses;
submission of one or more financial transaction requests to one or more markets;
transmission of data onto one or more computer networks;
acquisition of samples by one or more analog-to-digital converters;
conversion of samples into analog form by one or more digital-to-analog converters;
activation of one or more mechanical actuators;
activation of one or more sensors;
acquisition of measurements from one or more measurement devices;
turning on power to one or more lasers;
starting one or more engines;
starting one or more heaters;
initiating or changing flow through one or more dams.

18. The system of claim 16, wherein the second measurement and/or control process includes one or more of the following:
transmission of one or more wireless signals;
reception of one or more wireless signals;
transmission of one or more electrical signals onto one or more output buses;
reception of one or more electrical signals from one or more input buses;
submission of one or more financial transaction requests to one or more markets;
transmission of data onto one or more computer networks;
acquisition of samples by one or more analog-to-digital converters;
conversion of samples into analog form by one or more digital-to-analog converters;
activation of one or more mechanical actuators;
activation of one or more sensors;
acquisition of measurements from one or more measurement devices;
turning on power to one or more lasers;
starting one or more engines;
starting one or more heaters;
initiating or changing flow through one or more dams.

19. The system of claim 10, wherein the first cable is longer then the second cable, wherein an exponential coefficient of the leading edge of the first pulse is positive and smaller than an exponential coefficient of the leading edge of the second pulse.

20. A non-transitory memory medium storing program instructions, wherein the program instructions, when executed by a computer, cause the computer to implement:
directing time-domain reflectometry circuitry to perform time of flight measurements, wherein said performing time of flight measurements includes:
measuring a round-trip time of flight $TOF_1$ for a first pulse that is transmitted onto a first cable at a first end of the first cable, wherein the first pulse has a leading edge with exponential shape; and
measuring a round-trip time of flight $TOF_2$ for a second pulse that is transmitted onto a second cable at a first end of the second cable, wherein the second pulse has a leading edge with exponential shape;
determining time delay information, wherein said determining time delay information includes:
computing an input time delay $\Delta t_{IN}$ between (a) a time of transmission of the first pulse onto the first cable at the first end of the first cable and (b) a time of transmission of the second pulse onto the second cable at the first end of the second cable that would produce a desired output time delay $\Delta t_{OUT}$ between (c) an arrival time of the first pulse at a second end of the first cable and (d) an arrival time of the second pulse at a second end of the second cable, wherein the input time delay $\Delta t_{IN}$ is computed based on the round-trip time of flight $TOF_1$, the round-trip time of flight $TOF_2$ and the desired output time delay $\Delta t_{OUT}$; and
directing signal generation circuitry to perform pulse transmission according to the time delay information, wherein said pulse transmission includes:
transmitting the first pulse onto the first cable at the first end of the first cable and transmitting the second pulse onto the second cable at the first end of the second cable so that the time of transmission of the second pulse onto the second cable is delayed by $\Delta t_{IN}$ with respect to the time of transmission of the first pulse onto the first cable.

21. The non-transitory memory medium of claim 20,
wherein said performing time of flight measurements also includes:
measuring a round-trip time of flight $TOF_3$ for a third pulse that is transmitted onto a third cable at a first end of the third cable, wherein the third pulse has a leading edge with exponential shape;
wherein said determining time delay information also includes:
computing an input time delay $\Delta t_{IN}^{(3)}$ between the time of transmission of the first pulse onto the first cable at the first end of the first cable and a time of transmission of the third pulse onto the third cable at the first end of the third cable that would produce a desired output time delay $\Delta t_{OUT}^{(3)}$ between the arrival time of the first pulse at the second end of the first cable and an arrival time of the third pulse at a second end of the third cable, wherein the input time delay $\Delta t_{IN}^{(3)}$ is computed based on the round-trip time of flight $TOF_1$, the round-trip time of flight $TOF_3$ and the desired output time delay $\Delta t_{OUT}^{(3)}$;
wherein said pulse transmission also includes:
transmitting the third pulse onto the third cable at the first end of the third cable so that the time of transmission of the third pulse onto third cable is delayed by the input time delay $\Delta t_{IN}^{(3)}$ with respect to the time of transmission of the first pulse onto the first cable.

22. The non-transitory memory medium of claim 20, wherein said computing the input time delay $\Delta t_{IN}$ between the two pulses is performed according to the relation:

$$\Delta t_{IN} = (TOF_1/2) - (TOF_2/2) + \Delta t_{OUT}.$$

23. The non-transitory memory medium of claim 20, wherein an exponential coefficient value of the exponential shape of the leading edge of the first pulse is equal to an exponential coefficient value of the exponential shape of the leading edge of the second pulse.

24. The non-transitory memory medium of claim 20, wherein $\Delta t_{OUT}$ is set equal to zero.

25. The non-transitory memory medium of claim 20, wherein the second end of the first cable is coupled to a first remote unit, wherein the second end of the second cable is coupled to a second remote unit, wherein the arrival of the first pulse at the second end of the first cable causes the first remote unit to initiate a first measurement and/or control process, wherein the arrival of the second pulse at the second end of the second cable causes the second remote unit to initiate a second measurement and/or control process.

26. The non-transitory memory medium of claim 25, wherein the first measurement and/or control process includes one or more of the following:
   transmission of one or more wireless signals;
   reception of one or more wireless signals;
   transmission of one or more electrical signals onto one or more output buses;
   reception of one or more electrical signals from one or more input buses;
   submission of one or more financial transaction requests to one or more markets;
   transmission of data onto one or more computer networks;
   acquisition of samples by one or more analog-to-digital converters;
   conversion of samples into analog form by one or more digital-to-analog converters;
   activation of one or more mechanical actuators;
   activation of one or more sensors;
   acquisition of measurements from one or more measurement devices;
   turning on power to one or more lasers;
   starting one or more engines;
   starting one or more heaters;
   initiating or changing flow through one or more dams.

27. The non-transitory memory medium of claim 25, wherein the second measurement and/or control process includes one or more of the following:
   transmission of one or more wireless signals;
   reception of one or more wireless signals;
   transmission of one or more electrical signals onto one or more output buses;
   reception of one or more electrical signals from one or more input buses;
   submission of one or more financial transaction requests to one or more markets;
   transmission of data onto one or more computer networks;
   acquisition of samples by one or more analog-to-digital converters;
   conversion of samples into analog form by one or more digital-to-analog converters;
   activation of one or more mechanical actuators;
   activation of one or more sensors;
   acquisition of measurements from one or more measurement devices;
   turning on power to one or more lasers;
   starting one or more engines;
   starting one or more heaters;
   initiating or changing flow through one or more dams.

28. The non-transitory memory medium of claim 20, wherein the first cable is longer then the second cable, wherein an exponential coefficient of the leading edge of the first pulse is positive and smaller than an exponential coefficient of the leading edge of the second pulse.

* * * * *

UNITED STATES PATENT AND TRADEMARK OFFICE
CERTIFICATE OF CORRECTION

PATENT NO. : 9,331,842 B2
APPLICATION NO. : 14/862515
DATED : May 3, 2016
INVENTOR(S) : Robert H. Flake It is certified that error appears in the above-identified patent and that said Letters Patent is hereby corrected as shown below:

IN THE CLAIMS:

(Claim 9):
Column 19, Line 42, please delete "then" and substitute -- than --.

(Claim 19):
Column 21, Line 46, please delete "then" and substitute -- than --.

Signed and Sealed this
Twenty-first Day of June, 2016

Michelle K. Lee
*Director of the United States Patent and Trademark Office*